(12) United States Patent
Hu

(10) Patent No.: US 9,016,963 B2
(45) Date of Patent: Apr. 28, 2015

(54) COLOR FILM DEVELOPING APPARATUS

(75) Inventor: Liwei Hu, Guandong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 137 days.

(21) Appl. No.: 13/642,543

(22) PCT Filed: Sep. 5, 2012

(86) PCT No.: PCT/CN2012/081024
§ 371 (c)(1),
(2), (4) Date: Oct. 21, 2012

(87) PCT Pub. No.: WO2014/026416
PCT Pub. Date: Feb. 20, 2014

(65) Prior Publication Data
US 2014/0044429 A1   Feb. 13, 2014

(30) Foreign Application Priority Data

Aug. 13, 2012   (CN) .......................... 2012 1 0286041

(51) Int. Cl.
*G03D 5/00* (2006.01)
*G03F 7/30* (2006.01)

(52) U.S. Cl.
CPC ................ *G03D 5/00* (2013.01); *G03F 7/3064* (2013.01)

(58) Field of Classification Search
USPC .......... 396/611; 355/27; 118/52, 66; 700/121
See application file for complete search history.

(56) References Cited

U.S. PATENT DOCUMENTS 5,089,839 A * 2/1992 Nakano et al. ................ 396/611

* cited by examiner

*Primary Examiner* — Rochelle-Ann J Blackman
(74) *Attorney, Agent, or Firm* — Andrew C. Cheng

(57) ABSTRACT

The present invention provides a color film developing apparatus, which is used to uniformly develop photoresist on the surface of a substrate as manufacturing a liquid crystal panel, comprising a developing chamber. The developing chamber comprises a first developing chamber and a second developing chamber respectively set inclined to a horizontal plane; the inclined directions of the first developing chamber and the second developing chamber inclined to the horizontal plane are contrary to each other. The color film developing apparatus according to the present invention can avoid the secondary development of the photoresist on the inclined substrate caused by the developer flowing from top to bottom when the substrate passes the developing chamber and proceeds to develop; enhance the uniformity of the development of the substrate; improve the uniformity of the in-plane process; narrow the differences; improve the quality of the product.

17 Claims, 1 Drawing Sheet

COLOR FILM DEVELOPING APPARATUS

This application claims priority to Chinese Patent Application Serial No. 201210286041.2, named as "a color film developing apparatus", filed on Aug. 13, 2012, the specification of which is incorporated herein by reference.

BACKGROUND OF THE INVENTION

1. Field of the Invention

The present invention relates to the field of manufacturing liquid crystal panel, and in particular to a color film developing apparatus.

2. The Related Arts

In the field of manufacturing liquid crystal panel, the color film developing apparatus is mainly applied in the manufacturing process of R, G, B color filters, which may develop the photoresist on the surface of the substrate.

The structure of the known color film developing apparatus comprises a developing chamber 9, as shown in FIG. 3. The developing chamber 9 inclined to a horizontal plane T at a certain angle can fix the developing substrate at a certain angle and proceed to develop. The inclined substrate benefits the development and down-flow of the developer on the surface of the substrate, which prevents the remains of the developer caused by the bending of the substrate, and reduces the occurrence of product defects caused by poor liquid flow.

The structural design of the said color film developing apparatus is unreasonable and has some defects as follows: When the substrate proceeds to develop, the developer nozzle above the substrate sprays developer on the photoresist on the surface of the substrate, and the developer will flow from top to bottom along the inclined substrate. The down-flowed developer still have developing ability, which will keep reacting with the photoresist on the substrate during the downstream process, which results uneven development of the entire surface of the substrate, leading to a large developing difference of RGB process at the upper edge portion and the lower edge portion of the surface of the substrate, which affects the quality of the product to a certain extent.

SUMMARY OF THE INVENTION

The technical issue to be addressed by the present invention is to provide a color film developing apparatus, which can avoid uneven development of the photoresist on the inclined substrate caused by the developer flowing from top to bottom when the substrate passes the developing chamber and proceeds to develop; enhance the uniformity of the development of the substrate; improve the uniformity of the in-plane process; narrow the differences; improve the quality of the product.

The technical solution of the present invention provides: a color film developing apparatus, used to uniformly develop photoresist on the surface of a substrate as manufacturing a liquid crystal panel, comprises a developing chamber, which comprises a first developing chamber and a second developing chamber respectively set inclined to a horizontal plane; the inclined directions of the first developing chamber and the second developing chamber inclined to the horizontal plane are contrary to each other.

According to a preferred embodiment of the present invention, the inclined angle of the first developing chamber inclined to the horizontal plane is between 0° and 90°; the inclined angle of the second developing chamber inclined to the horizontal plane is between 90° and 180°.

According to a preferred embodiment of the present invention, the inclined angle ($\alpha$) of the first developing chamber inclined to the horizontal plane is between 5° and 10°; the inclined angle ($\beta$) of the second developing chamber inclined to the horizontal plane is between 170° and 175°.

According to a preferred embodiment of the present invention, the inclined angle of the first developing chamber inclined to the horizontal plane is supplementary to the inclined angle of the second developing chamber inclined to the horizontal plane.

According to a preferred embodiment of the present invention, the color film developing apparatus further comprises a transmitting mechanism used to transmit between the first developing chamber and the second developing chamber; the transmitting mechanism is set rotated and inclined to the horizontal plane.

According to a preferred embodiment of the present invention, the first developing chamber and the second developing chamber are provided the transmitting mechanism, respectively.

According to a preferred embodiment of the present invention, the first developing chamber and/or the second developing chamber are connected with a cleaning device used to remove the residual developer on the surface of the substrate.

According to a preferred embodiment of the present invention, the substrate is transmitted to the second developing chamber by the transmitting mechanism after passing the first developing chamber and the cleaning device.

The color film developing apparatus according to the present invention provides a first developing chamber and a second developing chamber set inclined to a horizontal plane, and the inclined directions of the first developing chamber and the second developing chamber inclined to the horizontal plane are contrary to each other, which counteracts the difference of the photoresist on the inclined substrate caused by the developer flowing from top to bottom when the substrate passes the developing chamber and proceeds to develop. Enhance the uniformity of the development of the substrate, improve the uniformity of the in-plane process, narrow the differences, and improve the quality of the product.

DETAILED DESCRIPTION OF THE PREFERRED EMBODIMENTS

The detailed descriptions according to the preferred embodiment of the present invention are as follows.

The present invention provides a color film developing apparatus, used to uniformly develop photoresist on the surface of a substrate as manufacturing a liquid crystal panel, comprising a developing chamber used to fix the developing substrate. The developing chamber comprises a first developing chamber 11 and a second developing chamber 12 set inclined to a horizontal plane; the inclined directions of the first developing chamber 11 and the second developing chamber 12 inclined to the horizontal plane are contrary to each other.

Figure 1:
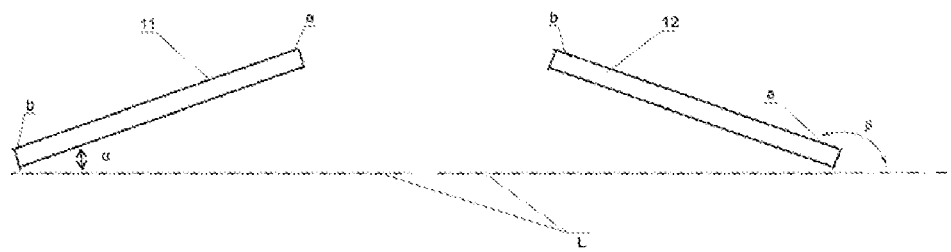
FIG. 1 is a schematic view illustrating the cross-sectional structure of the developing chamber of the color film developing apparatus according to the present invention.

Referring to FIG. 1, the color film developing apparatus can avoid one end side of the developed substrate being developed strongly by providing with two inclined developing chamber with opposite direction. The structure resulting in-plane uniformly developing is implemented as follows:

When the substrate passes the inclined first developing chamber 11, the developer nozzle above the first developing chamber 11 sprays developer on the photoresist on the surface of the substrate, and the developer will flow from top to bottom along the inclined substrate. The down-flowed developer still have developing ability, which will keep reacting with the photoresist on the substrate during the downstream process, which causes poorer development at the inclined substrate closed to the inclined top edge portion a than at the inclined substrate closed to the inclined bottom edge portion b. Next, the developed substrate passes the second developing chamber 12. Because the inclined direction of the second developing chamber 12 is contrary to that of the first developing chamber 11, the developer sprays on the end side of the said strongly developed b and flows from top to bottom along the inclined direction of the second developing chamber 12. The original poorly developed portion gets enhanced development, and then improves the uniformity of the in-plane development.

In the said embodiment, the inclined directions of the two developing chambers 11, 12 inclined to the horizontal plane and contrary to each other means: the inclined angles of the said two developing chambers set inclined to a horizontal plane are provided in different ranges. The two developing chambers set inclined to the horizontal plane are respectively provided in the range of both acute and obtuse angles, leading to opposite inclined direction relative to the horizontal plane.

For example, in one embodiment, the inclined angle ($\alpha$) of the first developing chamber 11 inclined to the horizontal plane L is provided in the range of acute angle between 0° and 90°; the inclined angle ($\beta$) of the second developing chamber 12 inclined to the horizontal plane L is provided in the range of obtuse angle between 90° and 180°.

In a preferred embodiment, the inclined angle ($\alpha$) of the first developing chamber 11 inclined to the horizontal plane is supplementary to the inclined angle ($\beta$) of the second developing chamber 12 inclined to the horizontal plane.

For example, the inclined angle ($\alpha$) of the first developing chamber inclined to the horizontal plane L is 5° (or any value between 5° and 10°); the inclined angle ($\beta$) of the second developing chamber inclined to the horizontal plane is 175° (or any value between 170° and 175°).

The motive of setting the two inclined angles supplementary to each other is as follows. Because the developer nozzles located above the two developing chambers have the same parameters and conditions of spraying developer, the provided supplementary inclined angles make the two developing chambers have the same inclination relative to the horizontal plane L. The flow rates of the developer on the two developing chambers are approximately the same, which improves the uniformity of the in-plane development.

Figure 2:
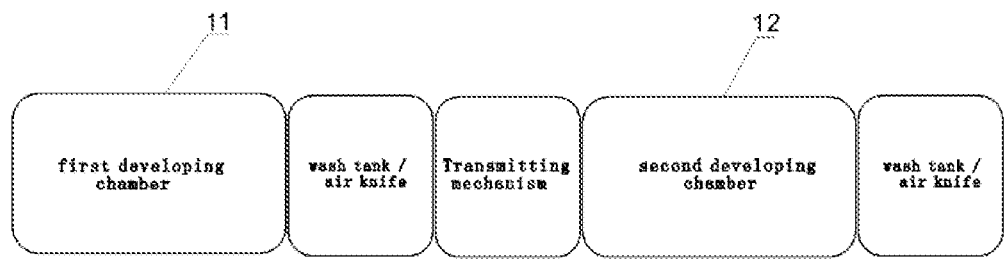
FIG. 2 is a schematic view illustrating the structure of the color film developing apparatus according to the present invention.
Figure 3:
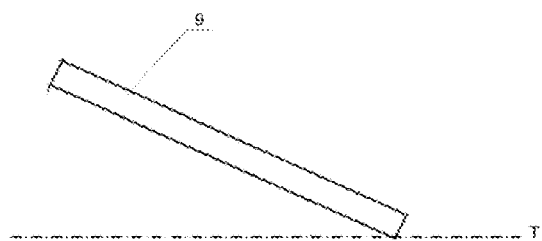
FIG. 3 is a schematic view illustrating cross-sectional structure of the developing chamber of a known color film developing apparatus.

The color film developing apparatus according to the present invention is implemented as follows:

The color film developing apparatus comprises a transmitting mechanism used to transmit between the first developing chamber 11 and the second developing chamber 12. As shown in FIG. 2, the transmitting mechanism can send the developed substrate from the first developing chamber 11 to the second developing chamber 12 and proceeds to develop.

In a preferred embodiment, the first developing chamber 11 and the second developing chamber 12 are provided with the transmitting mechanism, respectively. The transmitting mechanism is set rotated and inclined to the horizontal plane. In the embodiment, the transmitting mechanism can be maintained with the same inclination angle with the inclined angle $\alpha$ or the inclined angle $\beta$. By its own rotation, the developed substrate will be sent to the first developing chamber 11 and then rotated to the second developing chamber 12 and entering.

The color film developing apparatus according to the another embodiment of the present invention is provided with a cleaning device connected with the first developing chamber 11 and/or the second developing chamber 12, respectively. The cleaning device mainly comprises wash tank/air knife, the residual developer on the surface of the substrate can be removed by the wash tank/air knife and ready for the subsequent process.

Take the two developing chambers inclined to a horizontal plane L as example, wherein the inclined angle ($\alpha$) of the first developing chamber 11 inclined to the horizontal plane is 5°, and the inclined angle ($\beta$) of the second developing chamber 12 inclined to the horizontal plane is 175°, to describe the uniform development process of the color film developing apparatus to the photoresist on the substrate, the process is as follows:

The substrate is sent to the first developing chamber 11 by the transmitting mechanism, and then the developer nozzle located above the first developing chamber 11 sprays the developer to the photoresist on the substrate. The developer sprayed on the substrate flows from top to bottom along the inclined substrate, the downstream developer still has a strong developing ability, which will keep reacting with the photoresist on the substrate during the downstream process, which causes poorer development at the inclined substrate closed to the inclined top edge portion a than at the inclined substrate closed to the inclined bottom edge portion b.

Next, the substrate pass through the wash tank/air knife and remove the residual liquid on the surface of the substrate, and then is sent to the second developing chamber 12 by the transmitting mechanism. The inclined directions of the second developing chamber 12 and the first developing chamber 11 are contrary to each other, and the end side of the strongly developed b is located at higher position of the second developing chamber 12, as shown in FIG. 1. The developer is sprayed on it and flows from top to bottom along the inclined direction of the second developing chamber 12. The developer keeps reacting with the photoresist on the substrate during the downstream process, which enhances the development of the original poorly developed portion.

Because the developer nozzles located above the two developing chambers have the same parameters and conditions of spraying developer, the provided supplementary inclined angles make the two developing chambers have the same inclination relative to the horizontal plane L. The flow rates of the developer on the two developing chambers are approximately the same, which improves the uniformity of the in-plane development.

Finally, the substrate is sent to the wash tank/air knife by the transmitting mechanism to remove the residual liquid on the surface of the substrate.

In the other embodiments according to the present invention, the inclined angles of the two developing chambers are supplementary. All angle values contrary to the inclined direction of that relative to the horizontal plane are available. The other processes can also be used to improve the quality of the products instead of the cleaning device. When the parameters and conditions of spraying developer of the developer nozzles located above the two developing chambers are different, the inclined angles of the two developing chambers can be changed to make similar developing effects.

The color film developing apparatus according to the present invention is provided with the first developing chamber and the second developing chamber set inclined to a horizontal plane, and the inclined directions of two developing chambers inclined to the horizontal plane are contrary to each other, which decreases the difference of the photoresist on the inclined substrate caused by the developer flowing from top to bottom when the substrate passes the developing chamber and proceeds to develop. Enhance the uniformity of the development of the substrate, improve the uniformity of the in-plane process, narrow the differences, and improve the quality of the product.

What is claimed is:

1. A color film developing apparatus, used to uniformly develop photoresist on the surface of a substrate as manufacturing a liquid crystal panel, comprising: a developing chamber, characterized in that the developing chamber comprises a first developing chamber and a second developing chamber respectively set inclined to a horizontal plane;
the inclined directions of the first developing chamber and the second developing chamber inclined to the horizontal plane are contrary to each other;
characterized in that the inclined angle ($\alpha$) of the first developing chamber inclined to the horizontal plane is supplementary to the inclined angle ($\beta$) of the second developing chamber inclined to the horizontal plane.

2. The color film developing apparatus as claimed in claim 1, characterized in that the inclined angle ($\alpha$) of the first developing chamber inclined to the horizontal plane is between 0° and 90°; the inclined angle ($\beta$) of the second developing chamber inclined to the horizontal plane is between 90° and 180°.

3. The color film developing apparatus as claimed in claim 2, characterized in that the inclined angle ($\alpha$) of the first developing chamber inclined to the horizontal plane is between 5° and 10°; the inclined angle ($\beta$) of the second developing chamber inclined to the horizontal plane is between 170° and 175°.

4. The color film developing apparatus as claimed in claim 1, characterized in that the color film developing apparatus further comprises a transmitting mechanism used to transmit between the first developing chamber and the second developing chamber; the transmitting mechanism is set rotated and inclined to the horizontal plane.

5. The color film developing apparatus as claimed in claim 4, characterized in that the first developing chamber and the second developing chamber are provided with the transmitting mechanism, respectively.

6. The color film developing apparatus as claimed in claim 5, characterized in that the first developing chamber and/or the second developing chamber are connected with a cleaning device used to remove the residual developer on the surface of the substrate.

7. The color film developing apparatus as claimed in claim 6, characterized in that the substrate is transmitted to the second developing chamber by the transmitting mechanism after passing the first developing chamber and the cleaning device.

8. A color film developing apparatus, used to uniformly develop photoresist on the surface of a substrate as manufacturing a liquid crystal panel, comprising: a developing chamber, characterized in that the developing chamber comprises a first developing chamber and a second developing chamber respectively set inclined to a horizontal plane;
the inclined directions of the first developing chamber and the second developing chamber inclined to the horizontal plane are contrary to each other, and the inclined angle ($\alpha$) of the first developing chamber inclined to the horizontal plane is supplementary to the inclined angle ($\beta$) of the second developing chamber inclined to the horizontal plane.

9. The color film developing apparatus as claimed in claim 8, characterized in that the color film developing apparatus further comprises a transmitting mechanism used to transmit between the first developing chamber and the second developing chamber; the transmitting mechanism is set rotated and inclined to the horizontal plane.

10. The color film developing apparatus as claimed in claim 9, characterized in that the first developing chamber and the second developing chamber are provided with the transmitting mechanism, respectively.

11. The color film developing apparatus as claimed in claim 10, characterized in that the first developing chamber and/or the second developing chamber are connected with a cleaning device used to remove the residual developer on the surface of the substrate.

12. The color film developing apparatus as claimed in claim 11, characterized in that the substrate is transmitted to the second developing chamber by the transmitting mechanism after passing the first developing chamber and the cleaning device.

13. The color film developing apparatus as claimed in claim 9, characterized in that the inclined angle ($\alpha$) of the first developing chamber inclined to the horizontal plane is between 0°90°; the inclined angle ($\beta$) of the second developing chamber inclined to the horizontal plane is between 90° and 180°.

14. The color film developing apparatus as claimed in claim 9, characterized in that the inclined angle ($\alpha$) of the first developing chamber inclined to the horizontal plane is between 5° and 10°; the inclined angle ($\beta$) of the second developing chamber inclined to the horizontal plane is between 170° and 175°.

15. A color film developing apparatus, used to uniformly develop photoresist on the surface of a substrate as manufacturing a liquid crystal panel, comprising: a developing chamber, characterized in that the developing chamber comprises a first developing chamber and a second developing chamber respectively set inclined to a horizontal plane;
the inclined directions of the first developing chamber and the second developing chamber inclined to the horizontal plane are contrary to each other, and the inclined angle ($\alpha$) of the first developing chamber inclined to the horizontal plane is supplementary to the inclined angle ($\beta$) of the second developing chamber inclined to the horizontal plane;
the first developing chamber and the second developing chamber are provided the transmitting mechanism, respectively, the transmitting mechanism is set rotated and inclined to the horizontal plane, the transmitting mechanism is used to transmit between the first developing chamber and the second developing chamber.

16. The color film developing apparatus as claimed in claim 15, characterized in that the first developing chamber and/or the second developing chamber are connected with a cleaning device used to remove the residual developer on the surface of the substrate.

17. The color film developing apparatus as claimed in claim 16, characterized in that the substrate is transmitted to the second developing chamber by the transmitting mechanism after passing the first developing chamber and the cleaning device.

\* \* \* \* \*